United States Patent [19]

Dämbkes et al.

[11] Patent Number: 4,710,788
[45] Date of Patent: Dec. 1, 1987

[54] MODULATION DOPED FIELD EFFECT TRANSISTOR WITH DOPED $SI_xGE_{1-x}$-INTRINSIC SI LAYERING

[75] Inventors: Heinrich Dämbkes, Ulm; Hans-J. Herzog, Neu-Ulm; Helmut Jorke, Gerstetten, all of Fed. Rep. of Germany

[73] Assignee: Licentia Patent-Verwaltungs-GmbH, Frankfurt am Main, Fed. Rep. of Germany

[21] Appl. No.: 936,257

[22] Filed: Dec. 1, 1986

[30] Foreign Application Priority Data

Nov. 30, 1985 [DE] Fed. Rep. of Germany ....... 3542482

[51] Int. Cl.$^4$ ............................................ H01L 29/80
[52] U.S. Cl. ......................................... 357/22; 357/4; 357/16; 357/15; 357/61
[58] Field of Search ..................... 357/4, 4 SL, 16, 22, 357/15, 22 A, 22 MD, 61; 148/DIG. 160

[56] References Cited

U.S. PATENT DOCUMENTS

| | | | |
|---|---|---|---|
| 3,626,257 | 12/1971 | Esaki et al. | 357/4 SL |
| 3,626,328 | 12/1971 | Esaki et al. | 357/4 SL |
| 3,721,583 | 3/1973 | Blakeslee | 357/4 SL |
| 4,088,515 | 5/1978 | Blakeslee et al. | 357/16 |
| 4,529,455 | 7/1985 | Bean et al. | 357/16 |
| 4,661,829 | 4/1987 | Bean et al. | 357/4 |

OTHER PUBLICATIONS

K. Kaede et al., "High Speed GaAs/AlGaAs ... Structure," Appl. Phys. Lett., vol. 48 #16, Apr. 21, 1986 pp. 1096, 1097.

G. Dohler, "Doping Superlattices," J. Vac. Sci. Tech., vol. 16 #3, May/Jun. 1979, pp. 851-856.

T. P. Pearsall, "Germanium-Silicon Modulation-Doped p-Channel Field-Effect Transistor", Chemical Abstracts, vol. 103, Nov. 1985, p. 675.

H. M. Manasevit et al., "Electron Mobility Enhancement in Eptaxial Multilayer $Si-Si_{1-x}Ge_x$ Alloy Films on(100)Si", Applied Physics Letters, vol. 41, Sep. 1982, pp. 464-466.

R. People et al., "Modulation Doping in $Ge_xSi_{1-x}/Si$ Strained Layer Heterostructures", Applied Physics Letters, vol. 45, Dec. 1984, pp. 1231-1233.

T. P. Pearsall et al, "$Ge_xSi_{1-x}$ Modulation Doped p-Channel Field Effect Transistor", Proc. 1st Intern. Symp. on Silicon MBE, vol. 85-7, May 1985, pp. 400-405.

Primary Examiner—Joseph E. Clawson, Jr.
Attorney, Agent, or Firm—Spencer & Frank

[57] ABSTRACT

A modulation doped field effect transistor (MODFET) having an n-conductive channel. This channel is produced by a heterostructure formed on a silicon substrate and composed of a modulation doped $Si_{1-x}Ge_x$ layer as well as an undoped Si layer.

14 Claims, 3 Drawing Figures

MODULATION DOPED FIELD EFFECT TRANSISTOR WITH DOPED $SI_xGE_{1-x}$-INTRINSIC SI LAYERING

BACKGROUND OF THE INVENTION

The present invention relates to a modulation doped field effect transistor. More specifically, the present invention relates to a modulation doped field effect transistor composed of a silicon substrate on which a modulation doped silicon-germanium/silicon layer sequence has been applied, and at least one control electrode.

Such a transistor is also called a MODFET and is disclosed in the article by T. P. Pearsall et al, "$Ge_x$-$Si_{1-x}$ Modulation Doped p-Channel Field Effect Transistor", pages 400–405, Proc. 1st Intern. Symp. on Silicon MBE, Vol. 85-7, May, 1985, Toronto, Canada; Ed. J. C. Bean, Electrochemical Society, Pennington, N.J.

The MODFET disclosed there includes a sequence of semiconductor layers based on silicon (Si) which permits the construction of a MODFET having a so-called p-conductive channel. However, most circuit applications require field effect transistors (FET's) which have an n-conductive channel.

SUMMARY OF THE INVENTION

It is therefore an object of the present invention to provide a MODFET of the above stated type which has a sequence of semiconductor layers including at least one n-conductive channel.

The above object is achieved according to the present invention by a modulation doped field effect transistor including a silicon substrate on which a modulation doped silicon-germanium/silicon layer sequence has been applied, and at least one control electrode, a source electrode and a drain electrode disposed on the outermost silicon layer of the layer sequence, wherein the layer sequence includes at least one n-conductive channel formed by a heterostructure produced by at least one combination of an undoped silicon layer and at least one n-doped silicon-germanium layer.

A first advantage of the MODFET according to the invention is that there is high charge carrier mobility so that a transistor can be produced which has a high limit frequency.

A further advantage is that during operation of the n-type MODFET according to the invention, there is no electrical bias in the substrate. This makes it possible to prevent contacting of the substrate right from the start so that manufacturing costs can be reduced considerably in an advantageous manner.

The invention is based on a heterojunction in an $Si_{1-x}Ge_x$/Si semiconductor layer sequence in which a two-dimensional charge carrier gas is produced. This causes electrons to be carried essentially within the Si semiconductor layer of the heterojunction.

BRIEF DESCRIPTION OF THE DRAWINGS

The invention will be described in greater detail below with reference the drawings wherein.

DETAILED DESCRIPTION OF THE PREFERRED EMBODIMENTS

Figure 1:
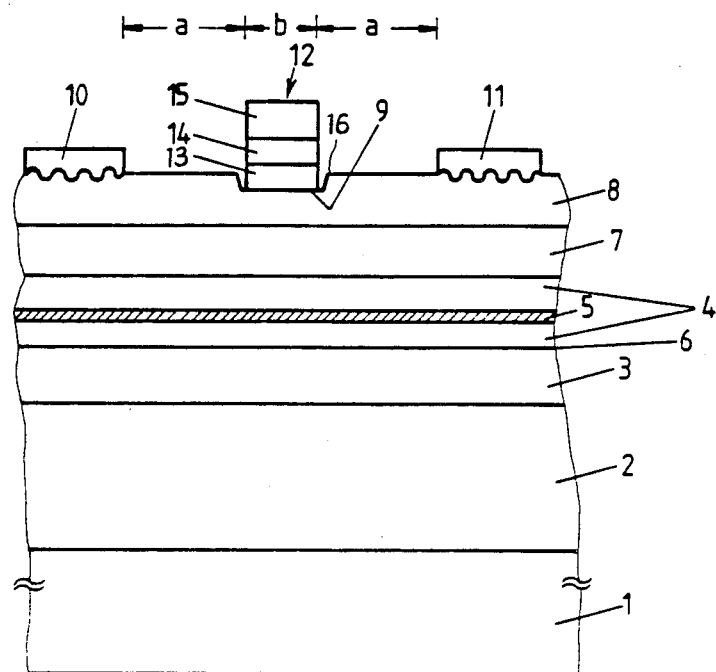
FIG. 1 is a schematic cross-sectional view of one embodiment of an n-type MODFET according to the invention used to explain the semiconductor layer sequence.

Referring now to FIG. 1, there is shown a silicon (Si) substrate 1, e.g. an Si wafer having a diameter of about 75 mm, a thickness of about 0.5 mm and a (100) crystal orientation. The silicon substrate 1 is $p^-$ conductive and has a high specific electrical resistance of about $10^4$ Ohm·cm. Due to this high specific resistance, annoying parasitic electrical effects, such as, for example, an undesirable current through the substrate, are advantageously avoided. With the aid of a molecular beam epitaxy (MBE) system, the semiconductor layer sequence 2–8 is now grown on the silicon substrate 1 at a low temperature, e.g. 900° K., and in an ultrahigh vacuum of $\leq 1 \cdot 10^{-9}$ mbar, to provide the modulation doped field effect transistor according to this invention.

First, a buffer layer 2 of an $Si_{0.75}Ge_{0.25}$ alloy is grown to a layer thickness of 0.2 μm. This buffer layer 2 has the result that crystal defects (mismatch offsets) are localized essentially at the substrate/buffer layer interface, i.e., the interface between the Si substrate 1 and the SiGe alloy layer 2, and a predeterminable mechanical stress distribution is produced for the subsequently applied semiconductor layers. This mechanical stress distribution can be set by selection of the composition of the SiGe alloy and/or by selection of the thickness of buffer layer 2. The germanium percentage of the layer 2 is preferably greater than twenty atom percent. An earlier not yet published Federal Republic of German patent application No. 35 37 363, corresponding to an U.S. patent application Ser. No. 06/864,469, filed May 19, 1986 by H. Herzog et al, describes how to select the thickness and Ge percentage of the buffer layer 2 to provide a predeterminable mechanical stress distribution.

On this buffer layer 2, a heterostructure is now grown which forms the n-conductive channel of the MODFET. This heterostructure includes, for example, an approximately 20 nm thick undoped Si layer 3 and with an overlying approximately 10 nm thick $Si_{0.5}Ge_{0.5}$ alloy layer 4 containing spatially limited n-type doping atoms, for example, a 2 nm thick region 5 containing antimony (Sb). In this connection, it is important to avoid contact between the n-type doping 5 and the undoped Si layer 3 at the heterojunction 6. The germanium percentage of the layer 4 should preferably be greater than twenty atom percent. The thicknesses of layers 3 and 4 have each been selected such that they lie below a so-called critical layer thickness. Thus it is also possible to set a predictable mechanical stress distribution in these layers. Only below a so-called critical layer thickness is the lattice of the grown layers elastically deformed without generating mismatch defects.

Applied to the surface of the $Si_{0.5}Ge_{0.5}$ layer 4 is a 10 nm thick SiGe transition layer 7 whose germanium content decreases constantly in a direction away from the layer 4. More specifically, the Ge content of layer 7 is highest at its interface with the $Si_{0.5}Ge_{0.5}$ layer 4, where it is, for example, 50 atom percent, and is lowest (approximately 0 atom percent) at the interface with the subsequently applied approximately 10 nm thick contacting layer 8 which is composed of undoped silicon. The spaced source and drain contacts 10 and 11 required for a field effect transistor are applied to this Si contacting layer 8. The source and drain terminals 10, 11 are here composed of a gold (Au)-antimony (Sb) alloy. Disposed between the source and drain contacts is the control electrode 12, the so-called gate terminal, for the MODFET with the control electrode forming a Schottky contact 9 at the contacting layer 8. This Schottky contact 9 is produced, for example, in that the control electrode 12 is composed of a platinum (Pt) layer 13 which contacts the silicon layer 8, an intermediate titanium (Ti) layer 14 and an outer gold (Au) layer 15.

The control electrode 12 has an exemplary width b of about 1.6 $\mu$m and an exemplary length (perpendicularly to the plane of the drawing) of about 160 $\mu$m. The distance a between the control electrode 12 and source and drain electrodes 10, 11, respectively, is about 1.5 $\mu$m. The distance between the Schottky contact 9 and the n-conductive channel can be set by reducing the layer thickness of contacting layer 8 in the region of control electrode 12 as shown. This is effected, for example, by means of an etching process to produce a recess 16 in the outer surface of the contact layer 8.

Figure 2:
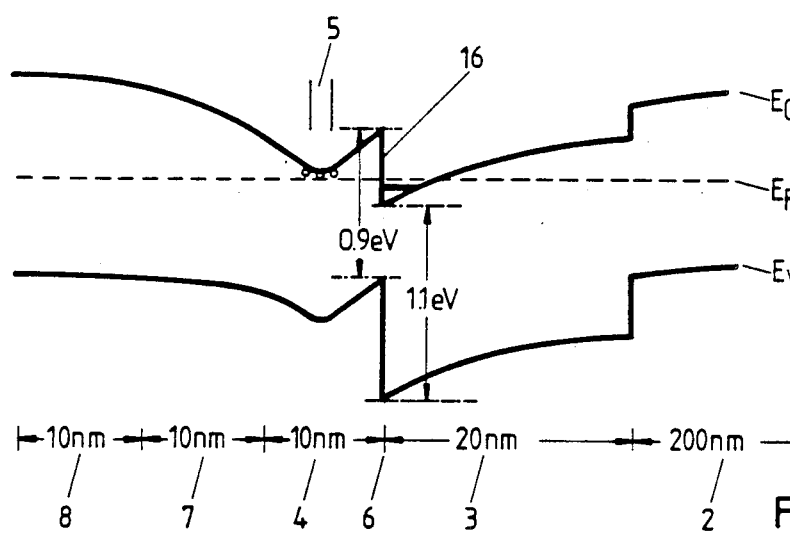
FIG. 2 is a schematic illustration of the associated band scheme.

FIG. 2 shows the energy band scheme for the embodiment of FIG. 1, and the reference numerals shown correspond to those of FIG. 1. The dimensions given, e.g. 20 nm, identify the thickness of the respective layers of FIG. 1. The curve marked $E_C$ identifies the conduction band, $E_F$ identifies the Fermi level and $E_V$ identifies the valence band. The magnitude of the sudden change 16 in the conduction band can be set by the Ge content of buffer layer 2 and/or the Ge containing semiconductor layers, e.g. layer 4, which produce the n-conductive channel. FIG. 2 shows that a decreasing Ge content in transition layer 7 is necessary because otherwise a further, annoying, sudden change in the conduction band would result between layers 7 and 8.

The above-described MODFET is able to attain a limit frequency of about 10 GHz.

The present invention is not limited to the above described embodiment but can be used similarly for others. For example, it is possible to produce an n-conductive channel in that the layer sequence bearing reference numerals 3 and 4 is repeated several times so that, for example, a so-called double or multi-heterostructure results.

Figure 3:
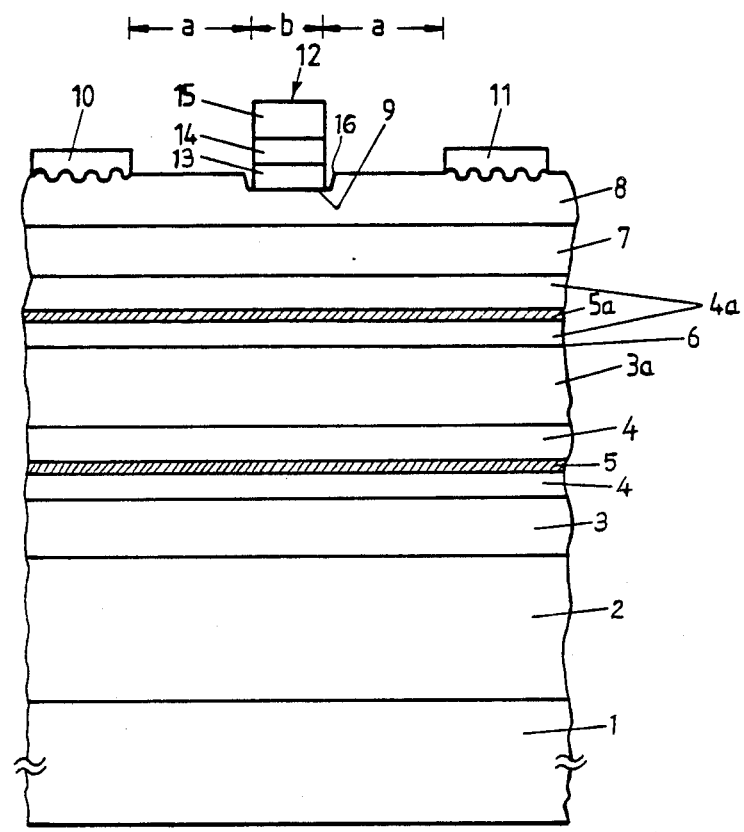
FIG. 3 is a schematic cross-sectional view of a further embodiment of an n-type MODFET according to the invention.

FIG. 3 shows a double heterostructure of a n-type MODFET. For example, on the buffer layer 2 a double heterostructure is grown which includes an approximately 20 nm thick undoped Si layer 3 and an overlying approximately 10 nm thick $Si_{0.5}Ge_{0.5}$ alloy layer 4 containing spatially limited n-type doping atoms, for example, a 2 nm thick region 5 containing Sb. The thicknesses of layers 3 and 4 have been selected such that they lie below a so-called critical layer thickness. Applied to the surface of the $Si_{0.5}Ge_{0.5}$ layer 4 is, for example, a 20 nm thick undoped Si layer 3a and an approximately 10 nm thick $Si_{0.5}Ge_{0.5}$ alloy layer 4a containing a spatially limited n-doped, for example, 2 nm thick region 5a containing Sb. On this $Si_{0.5}Ge_{0.5}$ alloy layer 4a is grown a $Si_{1-x}Ge_x$ layer 7 whose Ge content decrease constantly in a direction away from the layer 4a ($0 \leq x \leq 0.5$). It is also possible to use a slightly doped Si layer, which likewise permits the realization of a satisfactory Schottky contact 9, for the contacting layer 8.

The present disclosure relates to the subject matter disclosed in Federal Republic of Germany Application No. P 35 42 482.6 filed Nov. 30, 1986, the entire specification of which is incorporated herein by reference.

It will be understood that the above description of the present invention is susceptible to various modifications, changes and adaptations, and the same are intended to be comprehended within the meaning and range of equivalents of the appended claims.

What is claimed is:

1. In a modulation doped field effect transistor including a silicon substrate on which a modulation doped silicon-germanium alloy/silicon layer sequence has been applied, and at least one control electrode, a source electrode and a drain electrode disposed on the outermost silicon layer, the improvement wherein said layer sequence includes at least one n-conductive channel which is formed by a heterostructure produced by at least one combination of an undoped silicon layer and at least one n-doped silicon-germanium alloy layer.

2. A modulation doped field effect transistor as defined in claim 1, wherein said silicon substrate is highly resistant electrically, whereby annoying parasitic electrical effects are avoided.

3. A modulation doped field effect transistor as defined in claim 2 wherein said silicon substrate is p⁻ conductive.

4. A modulation doped field effect transistor as defined in claim 3 wherein said substrate has a specific electrical resistance of approximately $10^4$ Ohm cm.

5. A modulation doped field effect transistor as defined in claim 1 wherein the layer of said layer sequence applied directly to said silicon substrate is a buffer layer composed of a silicon-germanium alloy having an alloy ratio and layer thickness such that crystal defects are localized essentially at the interface between said silicon substrate and said buffer layer and a predetermined mechanical stress distribution results in the subsequently applied layer sequence.

6. A modulation doped field effect transistor as defined in claim 5 wherein the semiconductor layers forming said n-conductive channel each have a layer thickness which is less than a critical layer thickness, whereby additional mechanical stress defects are avoided.

7. A modulation doped field effect transistor as defined in claim 1 wherein the layers of said semiconductor layer sequence which forms said n-conductive channel includes one modulation doped silicon-germanium alloy layer which is n-doped.

8. A modulation doped field effect transistor as defined in claim 7 wherein antimony is used as the doping material for the n-doped silicon-germanium layer.

9. A modulation doped field effect transistor as defined in claim 7 wherein the n-type doping within said doped silicon-germanium alloy layer is spatially limited such that contact is avoided between the n-type doping and the heterojunction formed by said n-doped silicon-germanium alloy layer and the adjacent said undoped silicon layer.

10. A modulation doped field effect transistor as defined in claim 9 wherein: an undoped silicon-germanium alloy buffer layer is directly disposed between said silicon substrate and said undoped silicon layer forming said heterojunction; and a germanium percentage greater than 20 atom percent exists in said buffer layer and in said n-doped silicon-germanium alloy layer.

11. A modulation doped field effect transistor as defined in claim 10 wherein the magnitude of the sudden change in the conduction band at said heterojunction is set by selection of said germanium percentage in said buffer layer and in the germanium containing semiconductor layers which produce said n-conductive channel.

12. A modulation doped field effect transistor as defined in claim 9, further comprising a silicon-germanium transition layer disposed between the outermost of the semiconductor layers forming said n-conductive channel and the next succeeding silicon layer, with the germanium content of said transition layer decreasing with increasing distance from said n-conductive channel whereby a further sudden change in energy is avoided in the conduction band.

13. A modulation doped field effect transistor as defined in claim 12 wherein: said semiconductor layer sequence further includes an outermost undoped germanium-poor silicon contacting layer applied to said transition layer; said at least one control electrode is disposed on said undoped germanium-poor silicon contacting layer in order to activate said n-conductive channel; and said at least one control electrode forms a Schottky contact with said undoped germanium-poor silicon contacting layer.

14. A modulation doped field effect transistor as defined in claim 13 wherein: a recess of a desired depth is formed in the outer surface of said contacting layer; and said Schottky contact is disposed in said recess whereby the distance between said Schottky contact and said n-conductive channel is adjusted to a desired value.

* * * * *